(12) United States Patent
Van Der Net et al.

(10) Patent No.: US 7,450,215 B2
(45) Date of Patent: Nov. 11, 2008

(54) LITHOGRAPHIC PROJECTION APPARATUS, GAS PURGING METHOD, DEVICE MANUFACTURING METHOD AND PURGE GAS SUPPLY SYSTEM

(75) Inventors: Antonius Johannes Van Der Net, Tilburg (NL); Erik Johannus Josephus Van Bragt, Veldhoven (NL)

(73) Assignee: ASML Netherlands B.V., Veldhoven (NL)

(*) Notice: Subject to any disclaimer, the term of this patent is extended or adjusted under 35 U.S.C. 154(b) by 191 days.

(21) Appl. No.: 11/525,934

(22) Filed: Sep. 25, 2006

(65) Prior Publication Data

US 2007/0114467 A1 May 24, 2007

Related U.S. Application Data

(63) Continuation of application No. 10/894,365, filed on Jul. 20, 2004, now Pat. No. 7,113,254, which is a continuation-in-part of application No. 10/623,180, filed on Jul. 21, 2003, now Pat. No. 7,384,149.

(51) Int. Cl.
*G03B 27/52* (2006.01)

(52) U.S. Cl. .......................................... 355/30; 355/53

(58) Field of Classification Search .................. 355/30, 355/52, 53, 55, 67, 72–77; 250/492.1
See application file for complete search history.

(56) References Cited

U.S. PATENT DOCUMENTS

| | | | |
|---|---|---|---|
| 4,704,348 A | 11/1987 | Koizumi et al. | |
| 5,892,572 A | 4/1999 | Nishi | |
| 6,394,109 B1 | 5/2002 | Somekh | |
| 6,582,496 B1 | 6/2003 | Cheng et al. | |
| 6,724,460 B2 | 4/2004 | Van Schaik et al. | |
| 6,828,569 B2 | 12/2004 | Van Schaik et al. | |
| 2002/0057423 A1 | 5/2002 | Nogawa | |
| 2003/0035087 A1 | 2/2003 | Murayama | |
| 2005/0017198 A1 | 1/2005 | Van Der Net et al. | |

(Continued)

FOREIGN PATENT DOCUMENTS

EP   0 571 997 A1   12/1993

(Continued)

OTHER PUBLICATIONS

Singapore Written Opinion issued for Singapore Patent Application No. 200600932-8, dated Jun. 26, 2007.

*Primary Examiner*—Kiet T Nguyen
(74) *Attorney, Agent, or Firm*—Pillsbury Winthrop Shaw Pittman, LLP

(57) ABSTRACT

A lithographic projection apparatus is disclosed. The apparatus includes a radiation system for providing a beam of radiation, and a support for supporting a patterning device. The patterning device serves to pattern the beam of radiation according to a desired pattern. The apparatus also includes a substrate support for supporting a substrate, a projection system for projecting the patterned beam of radiation onto a target portion of the substrate, and a purge gas supply system. The purge gas supply system includes a purge gas mixture generator that includes a moisturizer that is arranged for adding moisture to a purge gas to generate a purge gas mixture, and a purge gas mixture outlet connected to the purge gas mixture generator for supplying the purge gas mixture to at least part of the lithographic projection apparatus.

8 Claims, 3 Drawing Sheets

U.S. PATENT DOCUMENTS

| | | | |
|---|---|---|---|
| 2005/0041226 A1* | 2/2005 | Tanaka et al. | 355/53 |
| 2005/0048220 A1 | 3/2005 | Mertens et al. | 427/553 |

FOREIGN PATENT DOCUMENTS

| | | |
|---|---|---|
| EP | 0 678 321 A2 | 10/1995 |
| EP | 1 489 462 A2 | 12/2004 |
| EP | 1 571 698 A1 | 9/2005 |
| EP | 1 628 163 A2 | 2/2006 |
| JP | 2001-358055 | 12/2001 |
| WO | WO 2004/053956 A1 | 6/2004 |
| WO | WO 2005/008339 A2 | 1/2005 |
| WO | WO 2005/010619 A2 | 2/2005 |

* cited by examiner

LITHOGRAPHIC PROJECTION APPARATUS, GAS PURGING METHOD, DEVICE MANUFACTURING METHOD AND PURGE GAS SUPPLY SYSTEM

CROSS-REFERENCE TO RELATED APPLICATIONS

This application is a continuation of U.S. application Ser. No. 10/894,365, filed now Jul. 20, 2004 now U.S. Pat. No. 7,113,254, which is a continuation-in-part of U.S. application Ser. No. 10/623,180, filed Jul. 21, 2003 now U.S. Pat. No. 7,384,149, the entire contents of which are incorporated herein by reference.

BACKGROUND OF THE INVENTION

1. Field of the Invention

The present invention relates to a lithographic projection apparatus, a gas purging method, a device manufacturing method, and a purge gas supply system.

2. Description of the Related Art

The term "patterning device" as here employed should be broadly interpreted as referring to a device that can be used to endow an incoming radiation beam with a patterned cross-section, corresponding to a pattern that is to be created in a target portion of the substrate; the term "light valve" can also be used in this context. Generally, the pattern will correspond to a particular functional layer in a device being created in the target portion, such as an integrated circuit or other device (see below). Examples of such a patterning device include a mask. The concept of a mask is well known in lithography, and it includes mask types such as binary, alternating phase-shift, and attenuated phase-shift, as well as various hybrid mask types. Placement of such a mask in the radiation beam causes selective transmission (in the case of a transmissive mask) or reflection (in the case of a reflective mask) of the radiation impinging on the mask, according to the pattern on the mask. In the case of a mask, the support will generally be a mask table, which ensures that the mask can be held at a desired position in the incoming radiation beam, and that it can be moved relative to the beam if so desired.

Another example of a patterning device is a programmable mirror array. One example of such a device is a matrix-addressable surface having a viscoelastic control layer and a reflective surface. The basic principle behind such an apparatus is that (for example) addressed areas of the reflective surface reflect incident light as diffracted light, whereas unaddressed areas reflect incident light as undiffracted light. Using an appropriate filter, the undiffracted light can be filtered out of the reflected beam, leaving only the diffracted light behind; in this manner, the beam becomes patterned according to the addressing pattern of the matrix-addressable surface. An alternative embodiment of a programmable mirror array employs a matrix arrangement of tiny mirrors, each of which can be individually tilted about an axis by applying a suitable localized electric field, or by employing a piezoelectric actuation device. Once again, the mirrors are matrix-addressable, such that addressed mirrors will reflect an incoming radiation beam in a different direction to unaddressed mirrors; in this manner, the reflected beam is patterned according to the addressing pattern of the matrix-addressable mirrors. The required matrix addressing can be performed using suitable electronic devices. In both of the situations described hereinabove, the patterning device can include one or more programmable mirror arrays. More information on mirror arrays as here referred to can be gleaned, for example, from U.S. Pat. Nos. 5,296,891 and 5,523,193, and International Patent Application Publications WO 98/38597 and WO 98/33096, which are incorporated herein by reference. In the case of a programmable mirror array, the support may be embodied as a frame or table, for example, which may be fixed or movable as required.

Another example of a patterning device includes a programmable LCD array. An example of such a construction is given in U.S. Pat. No. 5,229,872, which is incorporated herein by reference. As above, the support in this case may be embodied as a frame or table, for example, which may be fixed or movable as required.

For purposes of simplicity, the rest of this text may, at certain locations, specifically direct itself to examples involving a mask and mask table. However, the general principles discussed in such instances should be seen in the broader context of the patterning device as hereabove set forth.

Lithographic projection apparatus can be used, for example, in the manufacture of integrated circuits (ICs). In such a case, the patterning device may generate a circuit pattern corresponding to an individual layer of the IC, and this pattern can be imaged onto a target portion (e.g. including one or more dies) on a substrate (silicon wafer) that has been coated with a layer of radiation-sensitive material (resist). In general, a single wafer will contain a whole network of adjacent target portions that are successively irradiated via the projection system, one at a time. In current apparatus, employing patterning by a mask on a mask table, a distinction can be made between two different types of machine. In one type of lithographic projection apparatus, each target portion is irradiated by exposing the entire mask pattern onto the target portion in one go; such an apparatus is commonly referred to as a wafer stepper or step-and-repeat apparatus. In an alternative apparatus, commonly referred to as a step-and-scan apparatus, each target portion is irradiated by progressively scanning the mask pattern under the beam in a given reference direction (the "scanning" direction) while synchronously scanning the substrate table parallel or anti-parallel to this direction; since, in general, the projection system will have a magnification factor M (generally <1), the speed V at which the substrate table is scanned will be a factor M times that at which the mask table is scanned. More information with regard to lithographic devices as here described can be gleaned, for example, from U.S. Pat. No. 6,046,792, incorporated herein by reference.

In a manufacturing process using a lithographic projection apparatus, a pattern (e.g in a mask) is imaged onto a substrate that is at least partially covered by a layer of radiation-sensitive material (resist). Prior to this imaging step, the substrate may undergo various procedures, such as priming, resist coating and a soft bake. After exposure, the substrate may be subjected to other procedures, such as a post-exposure bake (PEB), development, a hard bake and measurement/inspection of the imaged features. This array of procedures is used as a basis to pattern an individual layer of a device, e.g. an IC. Such a patterned layer may then undergo various processes such as etching, ion-implantation (doping), metallization, oxidation, chemo-mechanical polishing, etc., all intended to finish off an individual layer. If several layers are required, then the whole procedure, or a variant thereof, will have to be repeated for each new layer. Eventually, an array of devices will be present on the substrate (wafer). These devices are then separated from one another by a technique such as dicing or sawing, whence the individual devices can be mounted on a carrier, connected to pins, etc. Further information regarding such processes can be obtained, for example, from the book "Microchip Fabrication: A Practical Guide to Semiconductor Processing", Third Edition, by Peter van Zant, McGraw Hill Publishing Co., 1997, ISBN 0-07-067250-4, incorporated herein by reference.

For the sake of simplicity, the projection system may hereinafter be referred to as the "lens"; however, this term should be broadly interpreted as encompassing various types of projection system, including refractive optics, reflective optics, and catadioptric systems, as appropriate, for example, for the exposure radiation being used, or for other factors such as the use of an immersion fluid or the use of a vacuum. The radiation system may also include components operating according to any of these design types for directing, shaping or controlling the beam of radiation, and such components may also be referred to below, collectively or singularly, as a "lens".

Further, the lithographic apparatus may be of a type having two or more substrate tables (and/or two or more mask tables). In such "multiple stage" devices the additional tables may be used in parallel, or preparatory steps may be carried out on one or more tables while one or more other tables are being used for exposures. Dual stage lithographic apparatus are described, for example, in U.S. Pat. No. 5,969,441 and WO 98/40791, both incorporated herein by reference.

The lithographic apparatus may also be of a type wherein the substrate is immersed in a liquid having a relatively high refractive index, e.g. water, so as to fill a space between the final element of the projection system and the substrate. Immersion techniques are well known in the art for increasing the numerical aperture of projection systems.

Although specific reference may be made in this text to the use of the apparatus according to the invention in the manufacture of ICs, it should be explicitly understood that such an apparatus has many other possible applications. For example, it may be employed in the manufacture of integrated optical systems, guidance and detection patterns for magnetic domain memories, liquid-crystal display panels, thin-film magnetic heads, etc. The skilled artisan will appreciate that, in the context of such alternative applications, any use of the terms "reticle", "wafer" or "die" in this text should be considered as being replaced by the more general terms "mask", "substrate" and "target portion", respectively.

In the present document, the terms "radiation" and "beam" are used to encompass all types of electromagnetic radiation, including ultraviolet (UV) radiation (e.g. with a wavelength of 365, 248, 193, 157 or 126 nm) and extreme ultra-violet (EUV) radiation (e.g. having a wavelength in the range 5-20 nm), as well as particle beams, such as ion beams or electron beams.

In general, surfaces of components present in a lithographic projection apparatus become contaminated during use, even if most of the apparatus is operated in vacuum. In particular the contamination of optical components in the lithographic projection apparatus, such as mirrors, has an adverse effect on the performance of the apparatus, because such contamination affects the optical properties of the optical components.

In the art, it is known to reduce contamination of optical components of a lithographic projection apparatus by purging a space of the lithographic projection apparatus in which such a component is located with an ultra high purity gas, which is from hereon referred to as a purge gas. The purge gas prevents contamination of the surface, for example molecular contamination with hydrocarbons.

A drawback of this known method is that the purge gas may have an adverse effect on the activity of chemicals used in the lithographic projection process. In particular, it is found by the applicant that some types of radiation-sensitive material (resist), in particular resists sensitive to ultra-violet radiation and acetal-base photo-resists, do not function properly in an environment provided with the purge gas. Experiments performed by the applicant have revealed that these resists require a moisture, e.g. water vapour, to develop.

Furthermore, the purge gas may have an effect on the performance of measurement devices present in the lithographic projection apparatus, such as interferometric instruments for example. It is found by the applicant that because of the lack of moisture, the purge gas affects the refractive index and thereby changes the outcome of interferometric measurements as well.

However, such a moisture is not present in the purge gas used in the known methods. Thus, contamination cannot be reduced using the known purge gas supply system for these types of resists.

Although also a clean gas, strictly speaking the gas used for gas bearings in e.g. an immersion lithography apparatus differs from a purge gas in that e.g. the purity requirements are less strict, and in that it is provided at a much higher pressure. This high pressure gas flow provides for a stable and small gap between a surface of the substrate and the "shower head" of the immersion lithography apparatus, thereby reducing the likelihood of collision between the shower head and the substrate. However, the same problem as regards affecting interferometric measurements because of lack of moisture also applies to air bearing gas.

SUMMARY OF THE INVENTION

It is a general aspect of the present invention to provide an improved lithographic projection apparatus, and in particular a lithographic projection apparatus in which contamination can be reduced with a purge gas without affecting the development of the resist.

It is a further aspect of the present invention to provide an improved lithographic projection apparatus in which purge gas and gas used in gas bearings do not affect interferometric measurements.

The invention therefore provides a lithographic projection apparatus that includes a radiation system for providing a beam of radiation;, and a support for supporting a patterning device. The patterning device serves to pattern the beam of radiation according to a desired pattern. The apparatus also includes a substrate table for holding a substrate, a projection system for projecting the patterned beam onto a target portion of the substrate, and at least one purge gas supply system for providing a purge gas to at least part of the lithographic projection apparatus. The purge gas supply system includes a purge gas mixture generator that includes a moisturizer arranged for adding moisture to a purge gas. The purge gas mixture generator is arranged for generating a purge gas mixture. The purge gas mixture includes at least one purge gas and moisture. The purge gas generator also includes a purge gas mixture outlet connected to the purge gas mixture generator for supplying the purge gas mixture to the part of the lithographic projection apparatus.

The invention also provides a method for providing a purge gas to at least part of a lithographic apparatus. The method includes adding moisture to a purge gas to generate a purge gas mixture, and supplying the purge gas mixture to at least a part of the lithographic projection apparatus. Thus, chemicals used in the lithographic projection apparatus are not affected by the purge gas.

According to a further aspect of the invention, a device manufacturing method is provided. The method includes projecting a patterned beam of radiation onto a target portion of a layer of radiation-sensitive material on a substrate, adding moisture to a purge gas to generate a purge gas mixture, and supplying the purge gas mixture near a surface of the substrate.

The invention further provides a purge gas supply system for a lithographic apparatus. The system includes a purge gas mixture generator that includes a moisturizer arranged for adding moisture to a purge gas. The purge gas mixture generator is arranged for generating a purge gas mixture. The purge gas mixture includes at least one purging gas and the moisture. The system also includes a purge gas outlet for supplying the purge gas mixture to at least part of the lithographic projection apparatus.

Further details, aspects and embodiments of the invention will be described, by way of example only, with reference to the attached drawings.

DETAILED DESCRIPTION

Figure 1:
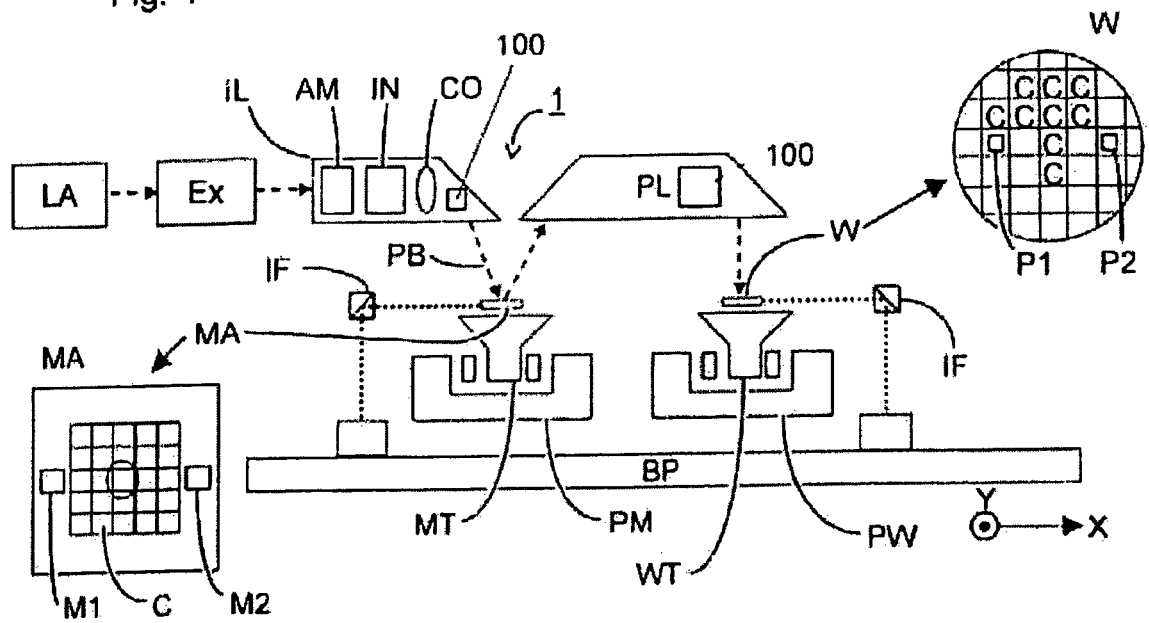
FIG. 1 schematically shows an example of an embodiment of a lithographic projection apparatus according to invention.

FIG. 1 schematically depicts an example of an embodiment of a lithographic projection apparatus 1 according to the invention. The apparatus 1 typically includes: a radiation system Ex, IL, for supplying a beam PB of radiation (e.g. UV or EUV radiation). In this particular case, the radiation system also includes a radiation source LA; a first object table (mask table) MT provided with a mask holder for holding a mask MA (e.g. a reticle), and connected to a first positioning device PM for accurately positioning the mask with respect to a projection system PL; a second object table (substrate table) WT provided with a substrate holder for holding a substrate W (e.g. a resist-coated silicon wafer), and connected to a second positioning device PW for accurately positioning the substrate with respect to item PL; and the projection system ("lens") PL (e.g. a mirror group) for imaging an irradiated portion of the mask MA onto a target portion C (e.g. including one or more dies) of the substrate W.

As here depicted, the apparatus is of a reflective type (i.e. has a reflective mask). However, in general, it may also be of a transmissive type, for example (with a transmissive mask). Alternatively, the apparatus may employ another kind of patterning device, such as a programmable mirror array of a type as referred to above.

The source LA (e.g. a Hg lamp, an excimer laser, an undulator or wiggler provided around the path of an electron beam in a storage ring or synchrotron, a laser-produced plasma source or otherwise) produces a beam of radiation. This beam is fed into an illumination system (illuminator) IL, either directly or after having traversed a conditioning device, such as a beam expander Ex, for example. The illuminator IL may include an adjusting device AM for setting the outer and/or inner radial extent (commonly referred to as σ-outer and σ-inner, respectively) of the intensity distribution in the beam. In addition, it will generally include various other components, such as an integrator IN and a condenser CO. In this way, the beam PB impinging on the mask MA has a desired uniformity and intensity distribution in its cross-section.

It should be noted with regard to FIG. 1 that the source LA may be within the housing of the lithographic projection apparatus (as is often the case when the source LA is a mercury lamp, for example), but that it may also be remote from the lithographic projection apparatus, the radiation beam which it produces being led into the apparatus (e.g. with the aid of suitable directing mirrors); this latter scenario is often the case when the source LA is an excimer laser. The current invention and claims encompass both of these scenarios.

The beam PB subsequently intercepts the mask MA, which is held on a mask table MT. Having been selectively reflected by the mask MA, the beam PB passes through the projection system PL, which focuses the beam PB onto a target portion C of the substrate W. With the aid of the second positioning device PW (and an interferometric measuring device IF), the substrate table WT can be moved accurately, e.g. so as to position different target portions C in the path of the beam PB. Similarly, the first positioning device PM can be used to accurately position the mask MA with respect to the path of the beam PB, e.g. after mechanical retrieval of the mask MA from a mask library, or during a scan. In general, movement of the object tables MT, WT will be realized with the aid of a long-stroke module (coarse positioning) and a short-stroke module (fine positioning), which are not explicitly depicted in FIG. 1. However, in the case of a wafer stepper (as opposed to a step-and-scan apparatus) the mask table MT may just be connected to a short stroke actuator, or may be fixed. Mask MA and substrate W may be aligned using mask alignment marks M1, M2 and substrate alignment marks P1, P2.

The depicted apparatus can be used in two different modes:

1. In step mode, the mask table MT is kept essentially stationary, and an entire mask image is projected in one go (i.e. a single "flash") onto a target portion C. The substrate table WT is then shifted in the x and/or y directions so that a different target portion C can be irradiated by the beam PB; and 2. In scan mode, essentially the same scenario applies, except that a given target portion C is not exposed in a single "flash". Instead, the mask table MT is movable in a given direction (the so-called "scan direction", e.g. the y direction) with a speed v, so that the beam PB is caused to scan over a mask image; concurrently, the substrate table WT is simultaneously moved in the same or opposite direction at a speed V=Mv, in which M is the magnification of the lens PL (typically, M=¼ or ⅕). In this manner, a relatively large target portion C can be exposed, without having to compromise on resolution.

Figure 2:
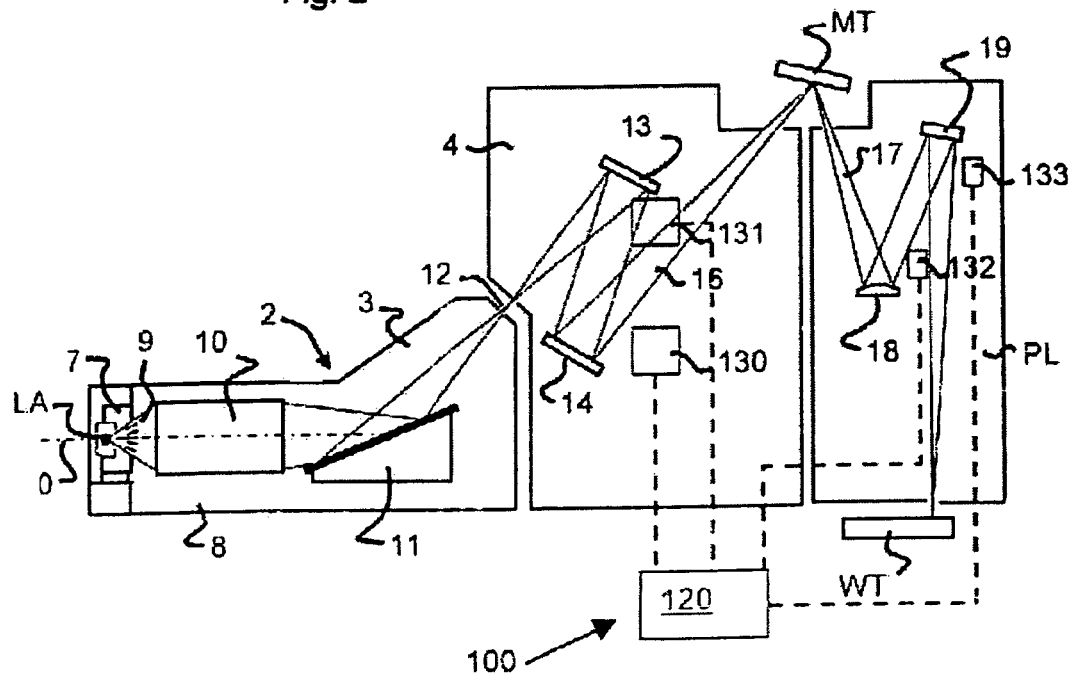
FIG. 2. shows a side view of an EUV illuminating system and projection optics of a lithographic projection apparatus according to the invention.

FIG. 2 shows a projection system PL and a radiation system 2 which can be used in the example of a lithographic projection apparatus 1 of FIG. 1. The radiation system 2 includes an illumination optics unit 4. The radiation system may also include a source-collector module or radiation unit 3. The radiation unit 3 is provided with a radiation source LA which may be formed by a discharge plasma. The radiation source LA may employ a gas or vapor, such as Xe gas or Li vapor in which a very hot plasma may be created to emit radiation in the EUV range of the electromagnetic spectrum. The very hot plasma is created by causing a partially ionized plasma of an electrical discharge to collapse onto the optical axis O. Partial pressures of 0.1 mbar of Xe, Li vapor or any other suitable gas or vapor may be required for efficient generation of the radiation. The radiation emitted by radiation source LA is passed from the source chamber 7 into collector chamber 8 via a gas barrier structure or "foil trap" 9. The gas barrier structure includes a channel structure such as, for example, described in detail in European patent applications EP-A-1 233 468 and EP-A-1 057 079, which are incorporated herein by reference.

The collector chamber 8 includes a radiation collector 10 which can be formed by a grazing incidence collector. Radiation passed by collector 10 is reflected off a grating spectral filter 11 to be focused in a virtual source point 12 at an aperture in the collector chamber 8. From chamber 8, the beam 16 is reflected in illumination optics unit 4 via normal incidence reflectors 13, 14 onto a reticle or mask positioned on reticle or mask table MT. A patterned beam 17 is formed which is imaged in projection system PL via reflective elements 18, 19 onto a wafer stage or substrate table WT. More elements than shown may generally be present in illumination optics unit 4 and projection system PL.

As is shown in FIG. 2 the example of a lithographic projection apparatus 1 according to an embodiment of the invention of FIG. 1 includes a purge gas supply system 100 according to the invention. Purge gas outlets 130-133 of the purge gas supply system 100 are positioned in the projection system PL and the radiation system 2 near the reflectors 13,14 and the reflective elements 18,19, as is shown in FIG. 2. However, if so desired other parts of the apparatus may likewise be provided with a purge gas supply system according to an embodiment of the invention. For example, a reticle and one or more sensors of the lithographic projection apparatus may be provided with a purge gas supply system according to the invention.

In FIGS. 1 and 2, the purge gas supply system 100 is positioned inside the lithographic projection apparatus 1 and the purge gas supply system 100 can be controlled in any manner suitable for the specific implementation using any convenient means outside the apparatus 1. However, it is likewise possible to position at least some parts of the purge gas supply system 100 outside the lithographic projection apparatus 1, such as for example the purge gas mixture generator 120 or otherwise.

Figure 3:
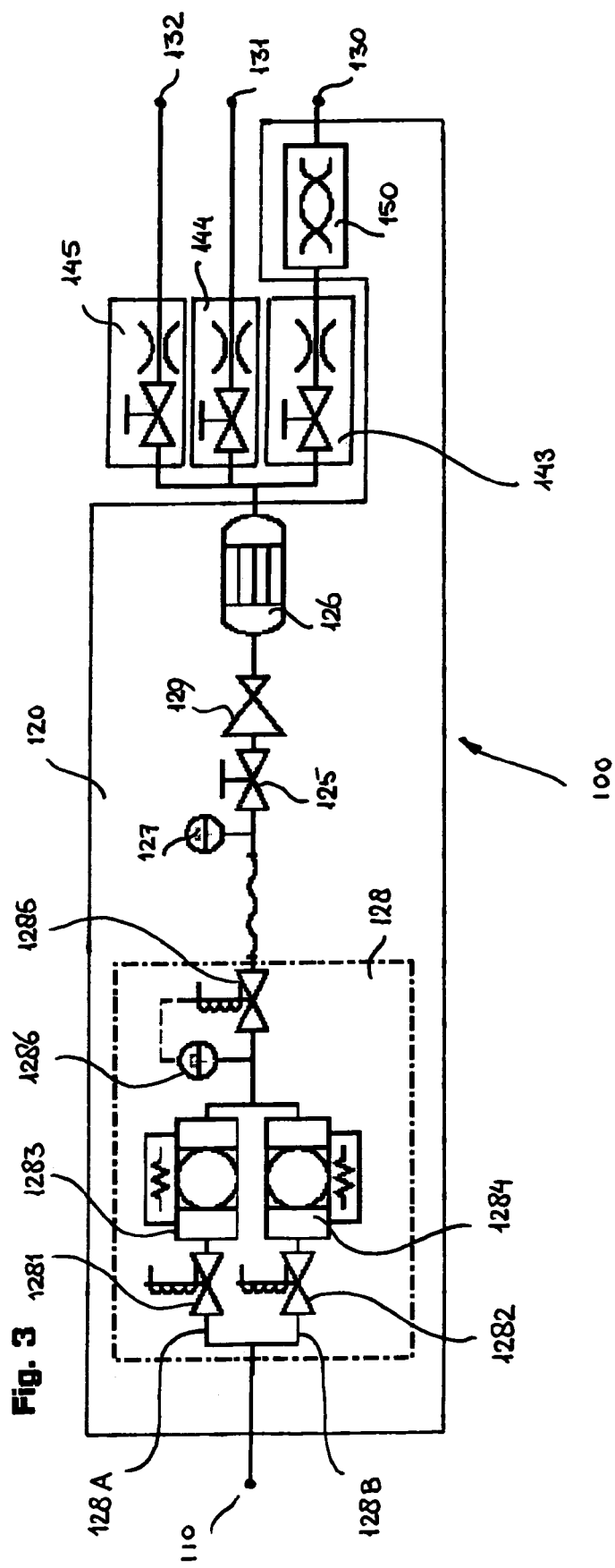
FIG. 3 schematically shows a circuit diagram of an example of a purge gas supply system according to the invention.

FIG. 3 shows a practical example of a purge gas supply system 100. However, a similar system as shown in FIG. 3 may likewise be utilized in conditioning gas used in gas bearings in e.g. an immersion lithography apparatus. In the example of FIG. 3, a purge gas inlet 110 is connected to a purge gas supply apparatus (not shown) which supplies a dry gas which is substantially without moisture, such as, for example, a pressurised gas supply circuit, a cylinder with compressed dry air or otherwise. The dry gas is fed through the purge gas mixture generator 120. In the purge gas mixture generator 120 the dry gas is purified further, as is explained below in more detail. Further, the purge gas mixture generator 120 includes a moisturizer 150 which adds a moisture to the dry gas, for some of the purge gas outlets 130-132. In the example of FIG. 3, the moisturizer 150 is connected a single purge gas outlet 130. The other purge gas outlets 131,132 are not connected to the moisturizer 150. Thus, at the purge gas outlet 130, a purge gas mixture including the purge gas and moisture is presented, whereas at the other purge gas outlets 131,132 only the dry purge gas is presented. Thereby the purge gas mixture may be provided only near surfaces provided with chemicals which require a moisture, such as the wafer table WT in the example of FIG. 1, whereas other parts of the lithographic projection apparatus 1 can be provided with a 'dry' purge gas, i.e, without moisture.

Furthermore, because the moisture is added to a purge gas, properties of the purge gas mixture, such as the relative humidity or purity of the moisture, can be controlled with a good accuracy. Also, because of the moisturizer the system is flexible, because the amount of moisture present in the purge gas mixture may easily be adjusted by adding more or less moisture to the purge gas.

The purge gas mixture generator 120 in the example of FIG. 3 includes, in a flow direction and that order: a purifier apparatus 128, a flow meter 127, a valve 125, a reducer 129, a heat exchanger 126 and a moisturizer 150.

In the example of FIG. 3, compressed dry air (CDA) from a, not shown, CDA source is supplied to the purifier apparatus 128 via the purge gas inlet 110. The CDA is purified by the purifier 128. The purifier 128 includes two parallel flow branches 128A,128B each including, in the flow direction and that order: an automatic valve 1281,1282 and a regenerable purifier device 1283,1284. The regenerable purifier devices 1283,1284 are each provided with a heating element to heat and thereby regenerate the respective purifier device 1283, 1284. The flow branches are connected downstream of the purifier devices 1283,1284 to a shut-off valve 1285 which is controlled by a purity sensor 1286.

Because of the regenerable purifiers, the system can be used for a long time period by regenerating the purifiers in case they become saturated with the compounds removed from the purge gas. The regenerable purifiers may be of any suitable type, such as for example a, known as such, regenerable filter which removes contaminating compounds or particles out of a gas by means of a physical process, such as adsorption, catalysis or otherwise, as opposed to the, non regenerable, chemical processes occurring in a charcoal filter, for example. In general, a regenerable purifier does not contain organic material and the regenerable purifiers may for example contain a material suitable for physical binding a contaminant of the purge gas, such as for example: metals, zeolite, titanium oxides, gallium or palladium compounds, or otherwise.

In the example of FIG. 3, the purifier devices 1283,1284 are alternately put in a purifying state in which the CDA is purified and a regenerating state. In the regenerating state the purifier device is regenerated by means of the respective heating element. Thus, for example, while the purifier device 1283 purifies the CDA, the purifier device 1284 is regenerated. The purifier 128 can thus operate continuously while maintaining a constant level of purification.

The automatic valves 1281,1282 are operated in correspondence with the operation of the corresponding purifier device 1283,1284. Thus, when a purifier device 1283,1284 is regenerated, the corresponding valve 1281,1282 is closed, while when a purifier device 1283,1284 is used to purify, the corresponding valve is open.

The purified CDA is fed through the shut-off valve 1285 which is controlled by the purity sensor 1286, which is known per se and for the sake of brevity is not described in further detail. The purity sensor 1286 automatically closes the shut-off valve 1285 when the purity of the purified CDA is below a predetermined threshold value. Thus, contamination of the lithographic projection apparatus 1 with a purge gas with insufficient purity levels is prevented automatically.

The flow of purified CDA can be monitored via the flow meter 127. Via the valve 125 the flow can be shut-off manually. The reducer 129 provides a stable pressure at the outlet of the reducer, thus a stable purge gas pressure is provided to restrictions (via the heat exchanger 126).

The heat exchanger 126 provides a constant purified CDA temperature. The heat exchanger 126 extracts or adds heat to the purified CDA in order to achieve a gas temperature which is suitable for the specific implementation. In a lithographic projection apparatus, for example, stable processing conditions are required and the heat exchanger may thus stabilize the temperature of the purified CDA to have a gas temperature which is constant over time. Suitable conditions for the purge gas at the purge gas outlets, for example, are found to be: a flow of 20-30 standard litres per minute, and/or a temperature of the purge gas of about 22 degrees Celsius and/or a relative humidity in the range of 30-60%. However, the invention is not limited to these conditions and other values for these parameters may likewise be used in a system according to the invention.

The heat exchanger 126 is connected via restrictions 143-145 to the purge gas outlets 130-132. The restrictions 143-145 limit the gas flow, such that at each of the purge gas outlets 130-132 a desired, fixed purge gas flow and pressure is obtained. A suitable value for the purge gas pressure at the purge gas outlets is for example 100 mbar. It is likewise possible to use adjustable restrictions to provide an adjustable gas flow at each of the purge gas outlets 130-132.

The moisturizer 150 is connected downstream from the heat exchanger between the restriction 143 and the purge gas outlet 130. The purge gas outlet 130 is provided in the example of FIGS. 1 and 2 near the wafer table WT. The moisturizer 150 adds a moisture to the purified CDA and thus provides a purge gas mixture to the outlet 130. In this example, only at a single outlet a purge gas mixture is discharged. However, it is likewise possible to discharge a purge gas mixture to two or more purge gas outlets, for example by connecting a multiple of purge gas outlets to separate moisturizers or connecting two or more outlets to the same moisturizer. It is likewise possible to provide a moisturizer at a different position in the purge gas mixture generator than is shown in FIG. 3. For example, the moisturizer 150 may be placed between the purge gas mixture generator 120 and the valve 143 instead of between the valve 143 and the purge gas outlet 130. The moisturizer 150 operates as a restriction as well and if so desired, the restriction 143 connected to the moisturizer 150 may be omitted.

In an alternative embodiment of a purge gas supply system according to the invention, an additional heat exchanger (not shown) is provided at the purge gas outlet 130 for a better temperature control of the purge gas mixture.

Figure 4:
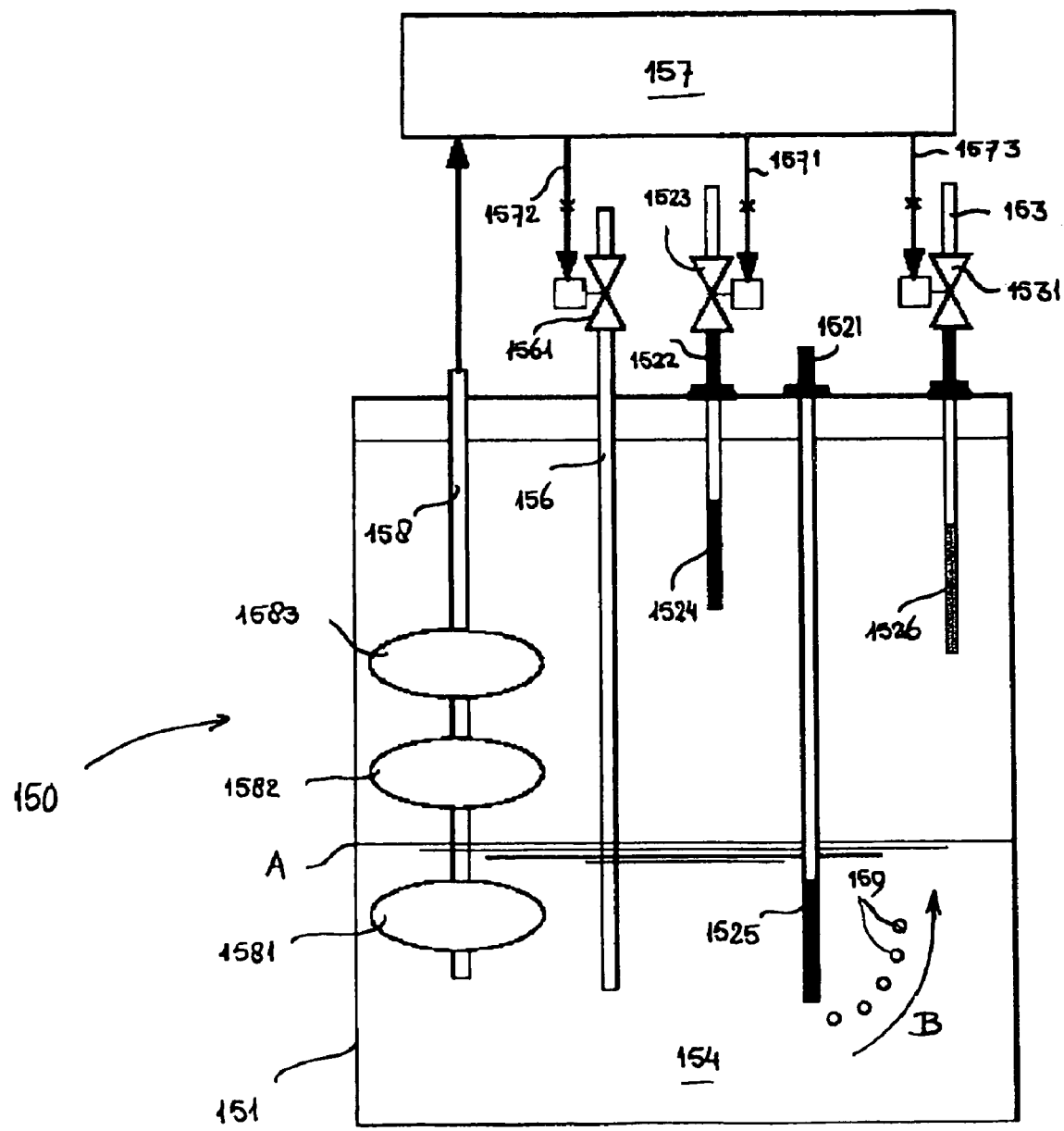
FIG. 4 schematically shows a moisturizer device suitable for in the example of FIG. 3.

The moisturizer 150 in FIG. 3 may for example be implemented as the example of FIG. 4, however the moisturizer 150 may likewise be implemented differently, and for example include a vaporiser which vaporises a fluid into a flow of purge gas or otherwise.

The moisturizer 150 shown in FIG. 4 includes a liquid vessel 151 which is filled to a liquid level A with a liquid 154, such as high purity water for example. A gas inlet 1521, from hereon referred to as the wet gas inlet 1521, is placed mounding submerged in the liquid 154, that is below the liquid level A. Another gas inlet 1522, from hereon referred to as the dry gas inlet 1522, is placed mounding above the liquid level A, i.e. in the part of the liquid vessel 151 not filled with the liquid 154. A gas outlet 153 connects the part of the liquid vessel 153 above the liquid 154 with other parts of the purge gas supply system 100. A purge gas, e.g. purified compressed dry air, is fed into the liquid vessel 151 via the wet gas inlet 1521. Thus, bubbles 159 of purge gas are generated in the liquid 154. Due to buoyancy forces, the bubbles 159 travel upwards after mounding in the liquid 154, as indicated in FIG. 4 with arrow B. During this upwards travelling period, moisture from the liquid 154 enters the bubbles 159, for example due to diffusive processes or otherwise. Thus, the purge gas in the bubbles 159 is mixed with a moisture. At the surface of the liquid i.e. at the liquid level A, the bubbles 159 supply their gaseous content to the gas(es) present in the liquid vessel 151 above the liquid 154. The resulting purge gas mixture is discharged from the vessel via the gas outlet 153.

In the example of FIG. 4, the wet gas inlet 1521 is a tubular element with an outside end connected outside the liquid vessel 151 to a, not shown, purge gas supply device, such as the purge gas mixture generator 120 of FIG. 3, for example. The wet gas inlet 1521 is provided with a filter element 1525 with small, e.g. 0.5 micron, passages at an inside end which is positioned in the inside of the liquid vessel 151. The filter element 1525 is at least partially, (in this example entirely) placed in the liquid 154. Thus, the wet gas inlet 1521 generates a large amount of very small bubbles of purge gas. Because of their small size, in this example about 0.5 micron however other suitable dimensions may likewise be used, the bubbles 159 are moisturized to saturation in a relatively short time period, i.e. a relatively short travelling distance through the liquid 154.

The dry gas inlet 1522 is provided with a filter element 1524 similar to the filter element of the wet gas inlet 1521. Thereby, the gas flow through the wet gas inlet 1521 and the dry gas inlet 1522 is substantially similar, and the amount of moisture in the purge gas mixture is substantially half the amount of moisture in the bubbles 159 at the moment the bubbles 159 leave the liquid 154. That is, if the bubbles 159 are saturated with moisture, i.e. 100% relative humidity (Rh), the purge gas mixture has a 50% Rh. However, it is likewise possible to provide in a different ratio of gas flowing into the liquid vessel via the wet gas inlet 1521 and the dry gas inlet 1522 respectively and thereby adjust the relative humidity between 0-100% Rh.

It is found by the applicant that specifically a purge gas mixture with a relative humidity above or equal to 20%, such as equal or more than 25%, provides good results with respect to the performance of photo-resists. Furthermore, it is found that a purge gas mixture with a relative humidity equal or above 25% and below 70%, such as 60%, has a good preventive effect with respect to the accuracy of measurement systems in the lithographic projection apparatus. Furthermore, it was found that a humidity, e.g. about 40%, which is similar to the humidity in the space surrounding the lithographic projection apparatus, e.g. the cleanroom, provides optimal results.

The gas outlet 153 is provided at its inside end with a fine-meshed, e.g. 0.003 micron, filter 1526 which filters particles and small droplets out of the gas flowing out of the liquid vessel 151. Thus, contamination of the surface to which the purge gas mixture is supplied by such particles is prevented.

In the example of FIG. 4, the relative amount of moisture in the purge gas mixture can be controlled in an uncomplicated manner, in different ways. For example parameters of the liquid vessel can be controlled. Also, for example, the amount of purge gas without moisture brought into the vessel 151 via the dry gas inlet 1522 relative to the amount of purge gas with moisture generated via the wet gas inlet 1521 can be controlled. The controlled parameters of the liquid vessel 151 may for example be one or more of: the inside temperature, flow, pressure, residence time of the purge gas in the liquid.

Temperature is known to have an effect on the saturation amount of moisture that can be present in a gas, for example. To control the temperature, the liquid vessel 151 may be provided with a heating element which is controlled by a control device in response to a temperature signal representing a temperature inside the liquid vessel provided by a temperature measuring device, for example.

The residence time of the bubbles in the liquid 154 can be changed by adjusting the position at which the gas bubbles are inserted in the liquid via the wet gas inlet 1521. For example when the filter 1525 is positioned further into the liquid 154, the distance the bubbles have to travel to the liquid level A is increased and hence the residence time increases as well. The longer the gas bubbles are present in the liquid 154, the more moisture can be absorbed into the gas. Thus, by changing the residence time the humidity of the gas can be adapted.

The moisturizer device 150 of FIG. 4 is further provided with a control device 157 via which the amount of moisture in the purge gas mixture can be controlled. As shown in FIG. 4, the control device 157 is connected with a moisture control contact 1571 to a control valve 1523 in the dry gas inlet 1522 via which the flow rate of the purge gas supplied to the dry inlet 1522 can be controlled and therefore the amount of dry purge gas relative to the amount of moisturized gas.

A humidity sensor (not shown) at the gas outlet 153, communicatively connected to the control device 157, provides to the control device 157 the humidity information of the purge gas mixture at the gas outlet 153. This information can be used by the control device 157 to adjust at least one of the parameters to control the amount of moisture in the purge gas mixture.

The control device 157 further controls the amount of liquid 154 present in the liquid vessel 151. The control device 157 is connected with a liquid control contact 1572 to a control valve 1561 of a liquid supply 156 and with an overflow contact 1573 to a control valve 1531 of the gas outlet 153. A liquid level measuring device 158 is communicatively connected to the control device. The liquid level measuring device 158 provides a liquid level signal to the control device 157 which represents a property of the liquid level in the liquid vessel 151. The control device 157 operates the control valve 1561 and a control valve 1531 in response to the liquid level signal.

In this example, the liquid level measuring device 158 includes three float switches 1581-1583 positioned at suitable, different, heights with respect to the bottom of the liquid vessel 151. A lowest float switch 1581 is positioned nearest to the bottom. The lowest float switch 1581 provides an empty signal to the control device 157 when the liquid level A is at or below the lowest float switch 1581. In response to the empty signal, the control devices 157 opens the control valve 1561 and automatically liquid is supplied to the vessel.

The float switch 1582 in the middle provides a full signal in case the liquid level A reaches the height of this flow switch 1582. The control device 157 closes the control valve 1561 in response to the full signal and thereby turns off the liquid supply.

A top float switch 1583 is positioned furthest away from the bottom. The top float switch 1583 provides an overfill signal to the control device 157 in case the liquid level A is at or above the top float switch 1581. In response to the overfill, the control device 157 shuts off the control valve 1531 of the gas outlet 153 to prevent leakage of the liquid into other parts of the lithographic projection apparatus 1.

It should be noted that the above-mentioned embodiments illustrate rather than limit the invention, and that those skilled in the art will be able to design alternatives without departing from the scope of the appended claims. In particular, although the invention has mainly been described in conjunction with a purge gas supply system, it is to be understood, however, that the invention may also be applied in providing a moisturized gas to be used in a high-pressure gas bearing in e.g. an immersion lithography apparatus.

What is claimed is:

1. An immersion lithographic projection apparatus, comprising:
   a radiation system for providing a beam of radiation;
   a support for supporting a patterning device, the patterning device serving to pattern the beam of radiation according to a desired pattern;
   a substrate table for holding a substrate;
   a projection system for projecting the patterned beam onto a target portion of the substrate; and
   at least one purge gas supply system for providing a purge gas mixture to at least part of the lithographic projection apparatus, said purge gas supply system comprising
      a purge gas mixture generator comprising a moisturizer arranged for adding moisture to a purge gas to generate the purge gas mixture; and
      a purge gas mixture outlet connected to the purge gas mixture generator for supplying the purge gas mixture to said at least part of the lithographic projection apparatus.

2. An immersion lithographic projection apparatus as claimed in claim 1, wherein the purge gas mixture generator further comprises a regenerable filter for filtering at least one undesired component out of the purge gas, the moisture, and/or the purge gas mixture.

3. An immersion lithographic projection apparatus as claimed in claim 1, wherein the purge gas supply system further comprises a purge gas outlet arranged for providing said purge gas substantially without moisture to another part of the lithographic projection apparatus.

4. An immersion lithographic projection apparatus as claimed in claim 1, wherein said moisture includes water vapor.

5. An immersion lithographic projection apparatus as claimed in claim 4, wherein said purge gas mixture contains between about 20% Rh water vapor, and about 70% Rh water vapor.

6. A method for providing a purge gas mixture to at least part of a lithographic projection apparatus comprising a radiation system for providing a beam of radiation; a support for supporting a patterning device, the patterning device serving to pattern the beam of radiation according to a desired pattern; a substrate table for holding a substrate; and a projection system for projecting the patterned beam onto a target portion of the substrate, said method comprising:
   adding moisture to a purge gas to generate said purge gas mixture; and
   supplying the purge gas mixture to at least a part of the lithographic projection apparatus.

7. A device manufacturing method comprising:
   projecting a patterned beam of radiation onto a target portion of a layer of radiation-sensitive material on a substrate;
   adding moisture to a purge gas to generate a purge gas mixture; and
   supplying the purge gas mixture near a surface of the substrate.

8. A purge gas supply system for providing a purge gas to at least part of an immersion lithographic projection apparatus, said purge gas supply system comprising:
   a purge gas mixture generator comprising a moisturizer arranged for adding moisture to a purge gas, said purge gas mixture generator being arranged for generating a purge gas mixture comprising at least one purging gas and said moisture; and
   a purge gas outlet for supplying the purge gas mixture to said at least part of the lithographic projection apparatus.

* * * * *